United States Patent
Kaka

(10) Patent No.: US 8,035,928 B2
(45) Date of Patent: Oct. 11, 2011

(54) HIGH SNR CPP READER USING HIGH FREQUENCY STANDING WAVE INTERFERENCE DETECTION

(75) Inventor: Shehzaad Kaka, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 457 days.

(21) Appl. No.: 12/351,154

(22) Filed: Jan. 9, 2009

(65) Prior Publication Data

US 2010/0177448 A1  Jul. 15, 2010

(51) Int. Cl.
  *G11B 5/33* (2006.01)
  *G11B 5/127* (2006.01)
(52) U.S. Cl. .................................. 360/313; 360/324.2
(58) Field of Classification Search ............... 360/313, 360/324.2
See application file for complete search history.

(56) References Cited

U.S. PATENT DOCUMENTS

| | | | |
|---|---|---|---|
| 2008/0144232 A1* | 6/2008 | Kaka et al. | 360/324.1 |
| 2008/0309329 A1* | 12/2008 | Kahlman et al. | 324/228 |
| 2009/0296258 A1* | 12/2009 | Miyanishi et al. | 360/75 |

\* cited by examiner

*Primary Examiner* — Ly D Pham
(74) *Attorney, Agent, or Firm* — Robert P. Lenart, Esq.; Pietragallo Gordon Alfano Bosick & Raspanti, LLP

(57) ABSTRACT

An apparatus includes a current perpendicular to the plane sensing element, a DC current source connected to the sensing element, a microwave AC current source connected to supply AC current to the sensing element, and a detector for measuring a voltage representative of phase difference between the AC current and AC voltage across the multilayer structure when the sensing element is subjected to a magnetic field. A method for sensing a magnetic field is also provided.

21 Claims, 9 Drawing Sheets

HIGH SNR CPP READER USING HIGH FREQUENCY STANDING WAVE INTERFERENCE DETECTION

BACKGROUND

The magnetic tunnel junction (MTJ) has emerged as the standard reader technology for present and next generation magnetic recording technology. However, areal density growth in magnetic recording demands a reduction of the reader dimensions resulting in an increasing reader resistance that decreases the signal to noise ratio (SNR). It is anticipated that all metallic current perpendicular to the plane (CPP) spin valve devices will be utilized as readers for 1 Tb/in.$^2$ recording because the resistance area (RA) product is much lower. The challenge of reducing readback noise in future high-density magnetic recording systems highlights the need to investigate alternative readback mechanisms and devices.

One such alternative readback system is the resonance reader, as previously disclosed in US Patent Application Publication 2008/0144232, which is hereby incorporated by reference.

SUMMARY

In a first aspect, the invention provides an apparatus including a current perpendicular to the plane sensing element, a DC current source connected to the sensing element, a microwave AC current source connected to supply AC current to the sensing element, and a detector for measuring a voltage representative of phase difference between the AC current and AC voltage across the multilayer structure when the sensing element is subjected to a magnetic field.

In another aspect the invention provides a method including: applying an AC current and a DC current to a current perpendicular to the plane sensing element, and detecting a phase difference between the AC current and AC voltage across the sensing element when the sensing element is subjected to a magnetic field.

DETAILED DESCRIPTION OF THE INVENTION

In one aspect, the invention provides an apparatus and method that allows a practical utilization of the resonance reader in a magnetic recording system. The resonance reader is a CPP device driven by spin momentum transfer (SMT) to ferromagnetic resonance and entrained by a stable external microwave current at a frequency close to the device resonance frequency. Readback occurs, in principle, by measuring the phase difference (phase shift) between the external microwave signal and that of the CPP device oscillation, wherein this phase difference is a function of external magnetic field applied to the device. The invention provides a mechanism to convert phase shift into an easy-to-detect amplitude modulation signal. Note that spin momentum transfer is sometimes called spin transfer torque or spin torque in the relevant literature.

Figure 1:
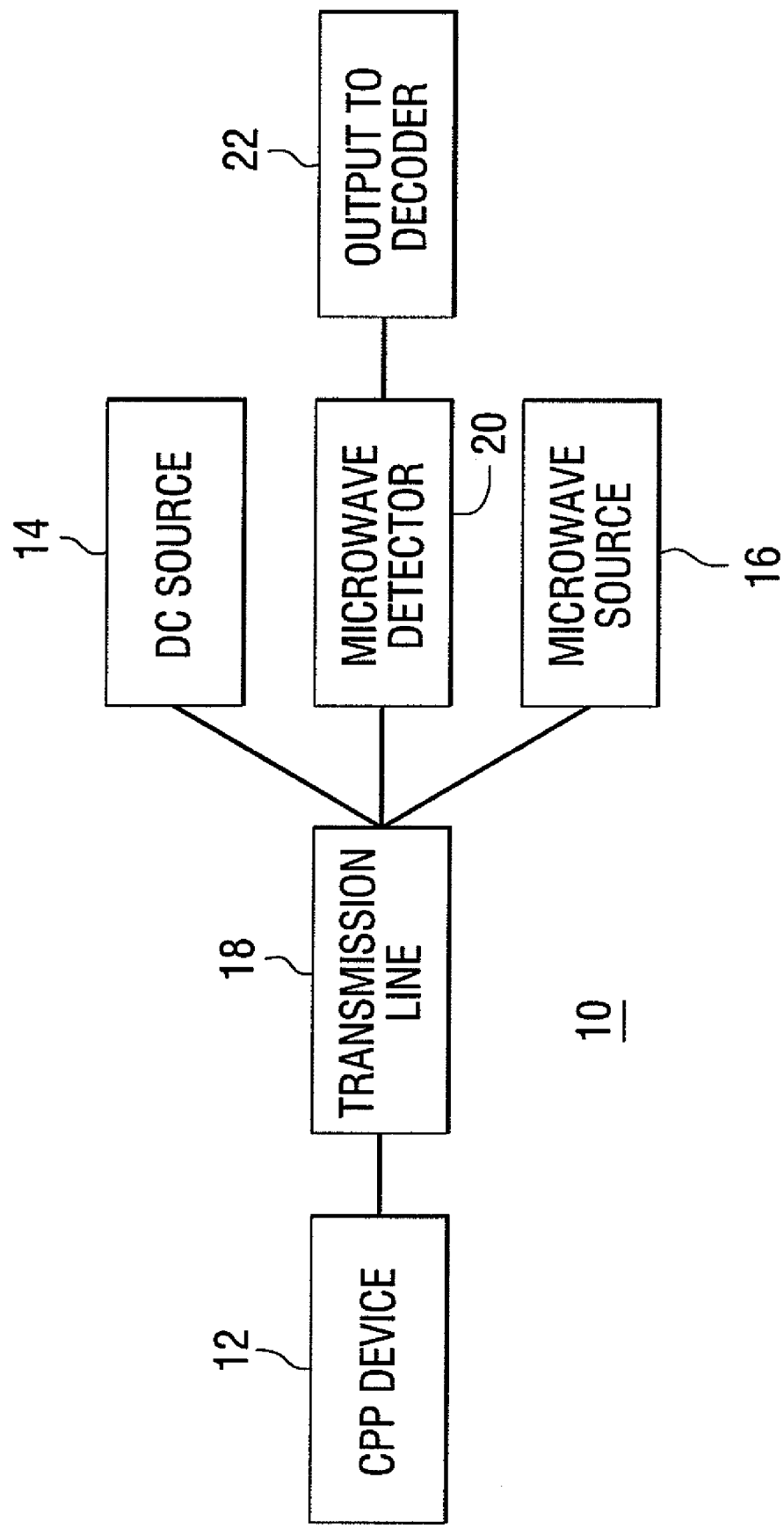
FIG. 1 is a block diagram of a resonance reader constructed in accordance with an aspect of the invention.

FIG. 1 is a block diagram of a resonance reader 10 constructed in accordance with an aspect of the invention. The reader includes a CPP device 12 (shown as a variable resistance) coupled to a DC current source 14 and a microwave current source 16 through a transmission line 18. A microwave detector 20 is also coupled to the transmission line, and is used to provide an output 22 to a decoder. The CPP device serves as a sensing element, wherein the precession of the device free layer changes when the device is subjected to an applied magnetic field, such as the magnetic field from magnetic regions of a magnetic data storage medium.

As seen in FIG. 1, resonance reader includes two inputs applied to the CPP device. One input is a DC current supplied by the DC current source. The DC current has a magnitude that is sufficient to produce spin momentum transfer (SMT) resistance oscillation at a known microwave frequency, $f_0$. The second input is a microwave current supplied by the microwave current source at a frequency $f_1$ very close to $f_0$. This microwave current entrains (phase locks) the CPP device resistance to oscillate only at $f_1$.

When the reader is implemented in a disc drive, the transmission line can be embedded in a flex-on-suspension (FOS), and can be used to carry both inputs to the CPP device. The DC current source, microwave current source, and the detector can be incorporated into read channel circuitry.

An impedance mismatch between the transmission line and the CPP device results in reflection of some input microwave power and causes a standing wave to form along the transmission line. When the CPP device is subjected to a magnetic field, for example from an adjacent magnetic storage media, it responds by changing the phase of its oscillation. The phase of the reflected wave also shifts, which results in a change in the shape of the standing wave along the transmission line. This change is detected as a change in the root mean squared (RMS) amplitude of a microwave signal at a fixed location along the transmission line.

Figure 2:
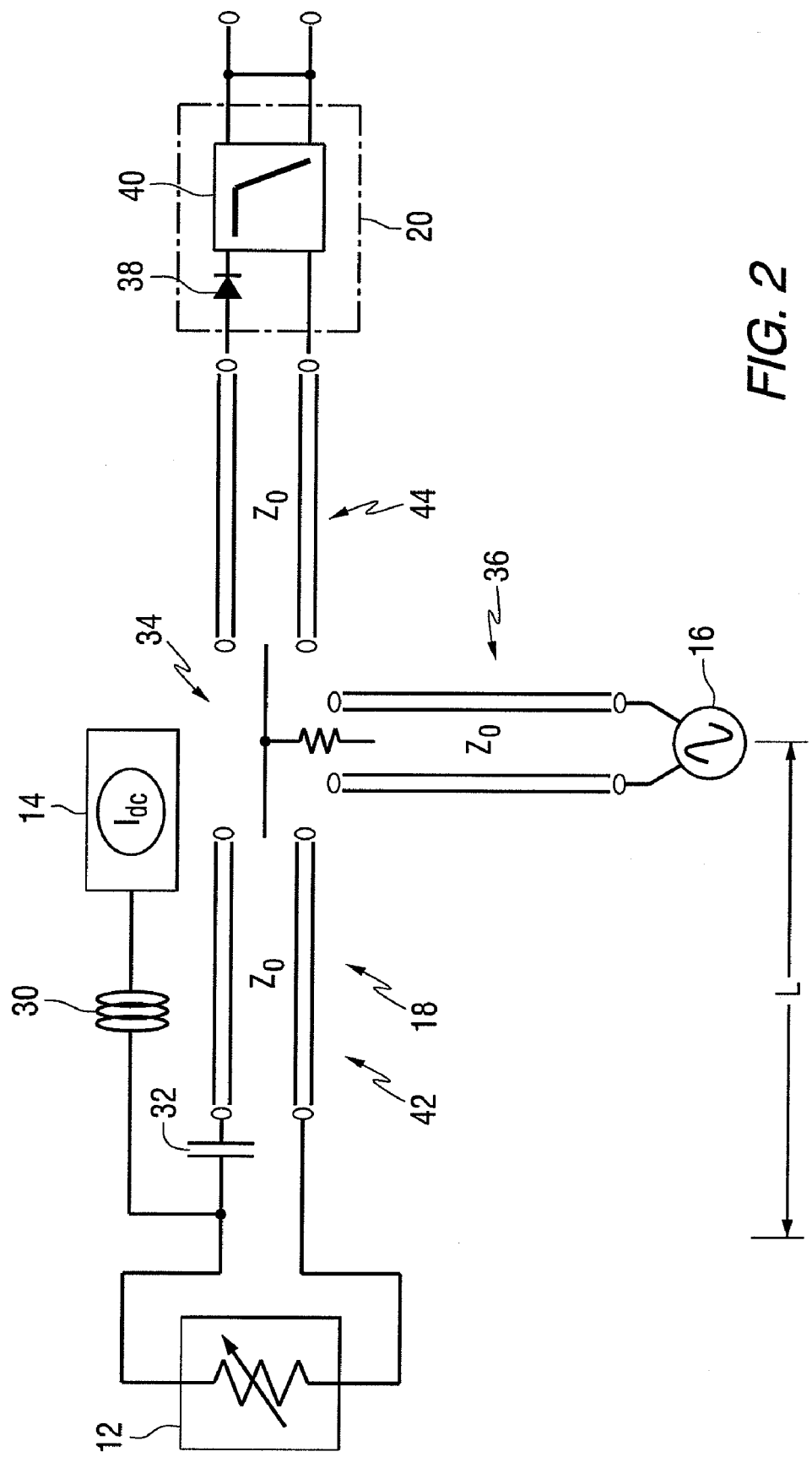
FIG. 2 is a schematic diagram of a resonance reader constructed in accordance with an aspect of the invention.

FIG. 2 is a schematic diagram of the reader. Again, the CPP device 12 is shown as a variable resistor. The DC current source 14 is coupled to the CPP device through an inductor 30. A capacitor 32 is connected between the CPP device and the transmission line 18. A three-port component such as a pick-off tee 34 is inserted in the transmission line. The microwave source 16 is coupled to one port of the tee through a second transmission line 36. The microwave detector 20 comprises an amplitude modulation detection circuit and is shown to include a diode 38 and a low pass filter 40. In this example a first portion 42 of transmission line 18, a second portion 44 of transmission line 18, and the second transmission line 36, each have a characteristic impedance of $Z_0$.

Figure 3:
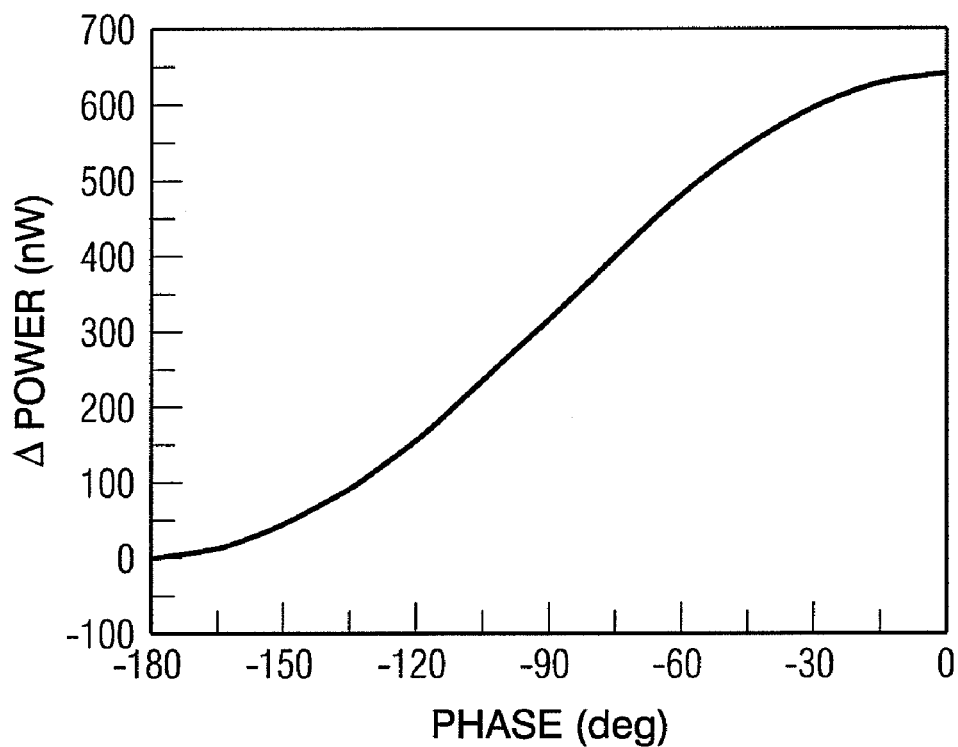
FIG. 3 is a graph of a calculated change in power as CPP device oscillation phase shifts.

Transmission line modeling results shown in FIG. 3 indicate how a change in phase of an oscillating load can affect the standing wave amplitude. For a typical SMT oscillator, the power output is usually a few nanowatts, but the standing wave power change works out to be a few hundred nanowatts. FIG. 3 shows the calculated change in power as the CPP device oscillation phase shifts. For calculated results in FIG.

3 the CPP device was assumed to have a resistance of R=10Ω, with a 0.2Ω ΔR, a −87 mV DC input (−2.9 mA), and a 20 mV microwave input. The detection location is the standing wave maximum along the transmission line. Transmission line losses are not accounted for in this model.

A diode followed by a low pass filter, which is an elementary amplitude modulation (AM) detector, can be used to detect the RMS microwave power. In one example, the low pass filter knee frequency $f_L$ should be just above the required data rate for readback, and the frequency of the microwave source $f_1$, should be $f_1 \geqq 10\ f_L$ for proper averaging of the power.

Phase modulation of the CPP device oscillation due to external magnetic fields thus results in an amplitude modulated voltage output that is representative of the bit pattern on the disc. By virtue of entrainment (phase locking), the CPP device oscillation noise becomes equivalent to the noise of the AC input source. Hence, it is desirable to use a microwave source with low phase and amplitude noise. Mag-noise due to thermal fluctuations is eliminated, and the controlled use of the SMT effect becomes an advantage rather than an additional noise source.

A proof-of-concept of RF amplitude detector using a resonance reader has been demonstrated in a laboratory experiment. In the proof-of-concept design, a 10Ω CPP spin valve device is connected to a 50Ω transmission line cable using 40 GHz bandwidth pico-probes. The device produces 4.77 GHz oscillations with a linewidth of 200 MHz when a DC current of 2.9 mA and a field of about 2500 Oe are applied.

Figure 4:
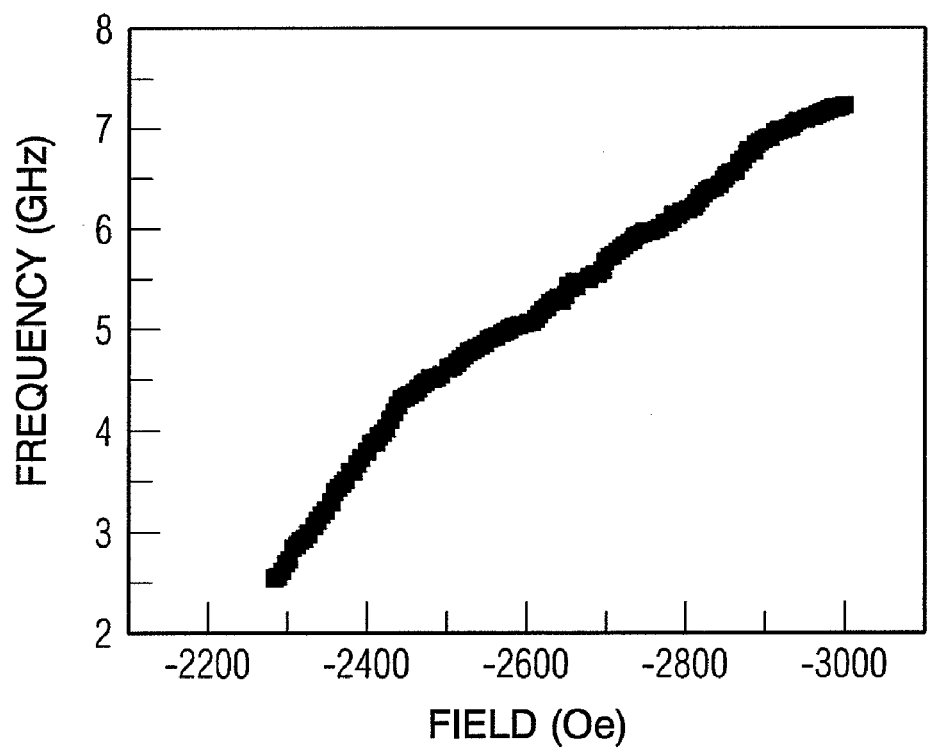
FIG. 4 is a graph of frequency versus magnetic field.

The oscillator frequency varies monotonically as the magnetic field is swept around 2500 Oe. FIG. 4 shows the measured frequency vs. field for a CPP spin valve device undergoing SMT oscillations. A single-frequency microwave current at 4.77 GHz is injected onto the transmission line, and as a result of reflection at the device end of the transmission line, a standing wave forms.

Figure 5:
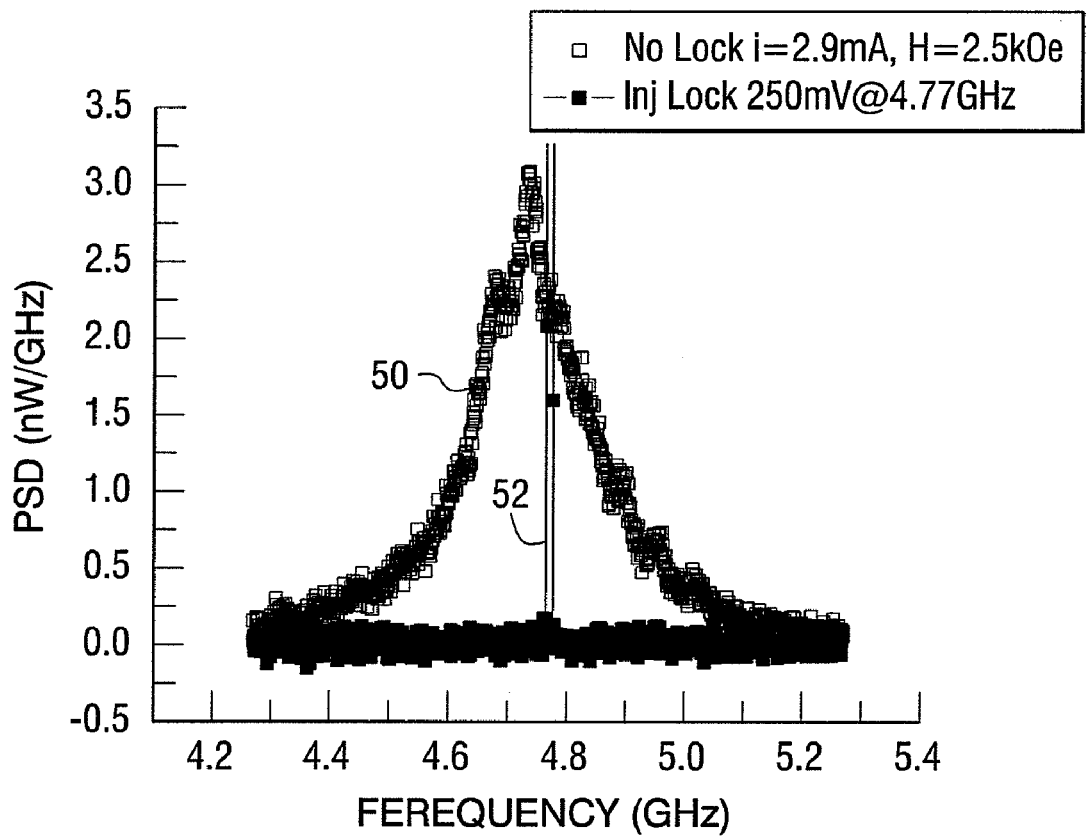
FIG. 5 is a graph of power spectral density versus frequency.

FIG. 5 is a graph of power spectral density emerging from the transmission line versus frequency. Trace 50 shows the free running condition, when the CPP device is subject to a DC current of 2.9 mA and a magnetic field of 2.5 kOe, without the application of a microwave voltage. Under these conditions, the CPP device precesses, and produces a resistance oscillation centered at about 4.77 GHz. Trace 52 shows the effects of phase locking when a 4.77 GHz microwave signal is also applied to the CPP device. The microwave current phase locks the device's oscillation, resulting in low phase noise behavior. Note that no power is emitted at the adjacent frequencies, thus the phase noise is that of the much quieter microwave source only.

Figure 6:
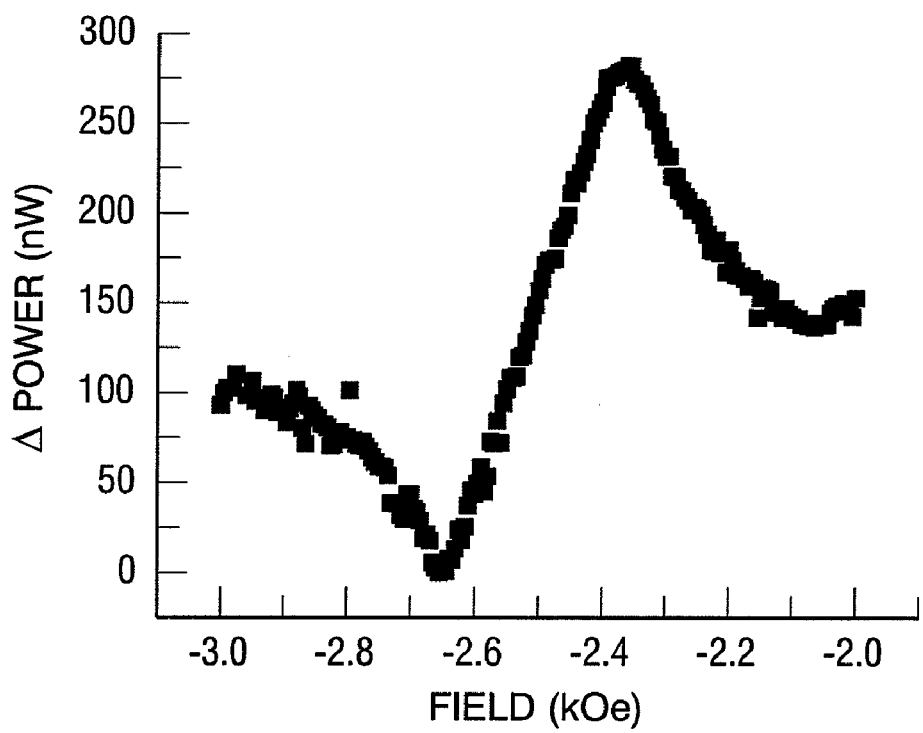
FIG. 6 is a graph of change in power versus magnetic field.

A spectrum analyzer in zero-span mode at 4.77 GHz was used to measure the RMS microwave power at the other end of the transmission line. The phase length of the transmission line was adjusted using a phase shifter such that the spectrum analyzer was measuring a maximum in power (standing wave maximum). The field was then varied from about 3000 Oe to about 2000 Oe. Over this range, the power measured by the spectrum analyzer varied by about 300 nW. The variation in power as a function of the swept field is shown in FIG. 6, which shows the change in standing wave power as measured at the standing wave maximum. The region between about 2600 Oe and about 2400 Oe has a substantially linear behavior, which corresponds to a change in phase shift over a range of 180° of the CPP device oscillation.

In the range of about 2600 to about 2400 Oe, the power varies substantially linearly with a sensitivity of about 1 nW/Oe. The field range over which the response is substantially linear varies with the amplitude of the injected microwave current. This substantially linear transfer curve can serve as the basis for potential sensor applications, such as in a recording head reader, or in a low noise field sensor.

For use in magnetic recording, this reader concept comprises two aspects: a) the physical reader transducer (i.e., sensing element) that undergoes phase modulation of its resistance oscillation, and b) the microwave circuit that converts the transducer phase modulation into an amplitude modulation output signal corresponding to the bits on the storage media.

In one example, the physical transducer should be sensitive to fields in the range of about ±300 Oe in a direction perpendicular to the air bearing surface of a slider containing the transducer. This requirement imposes a strict constraint on the design space for the CPP device. Most CPP devices require at least a few kilo-Oersteds bias field to undergo SMT oscillation. However, a CPP multilayer structure can meet the field range sensitivity requirement.

Figure 7:
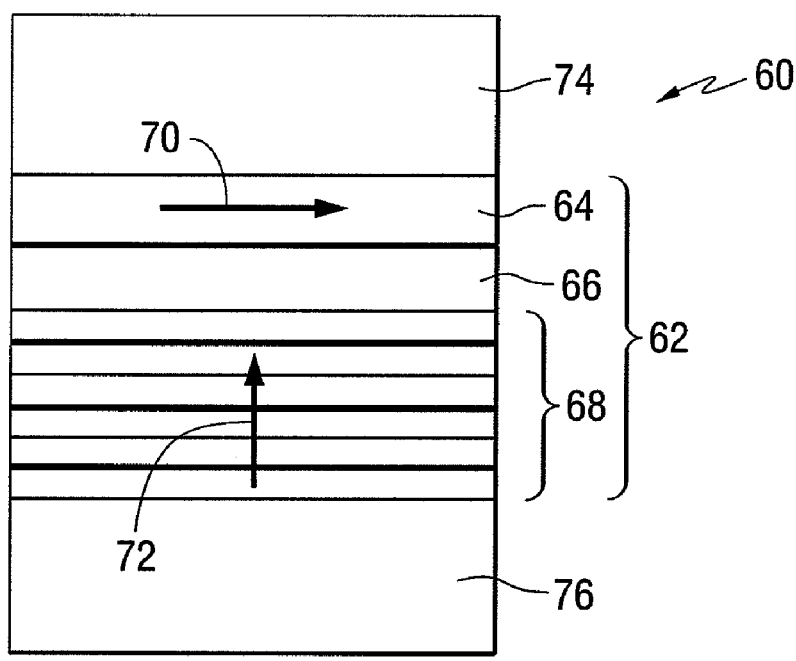
FIG. 7 is a schematic representation of a CPP sensor.

FIG. 7 shows an illustration of a CPP structure 60 that can be used as the sensing element in an aspect of the invention. The structure includes a multilayer stack 62 including an in-plane magnetic free layer 64, a non-magnetic spacer layer 66, and an out-of-plane magnetic fixed layer 68. The free layer can be a soft magnetic film such as, but not limited to, alloys of CoFe, NiFe, etc. The free layer has quiescent direction of magnetization substantially in the plane of the free layer as illustrated by arrow 70. The fixed layer is itself a multilayer with perpendicular to the plane magnetic anisotropy, as illustrated by arrow 72. The fixed layer configuration can be, for example, 5 to 50 repeats of layer pairs such as, but not limited to, Co/Pt, Co/Ni, Co/Au, etc. In the structure of FIG. 7, the CPP stack is shown to include a spacer layer that may be a metallic material (such as for example copper) or an insulator (such as for example MgO). The multilayer stack 62 is positioned between two conductors 74, 76, which can be the shields of a magnetic recording head.

Figure 8:
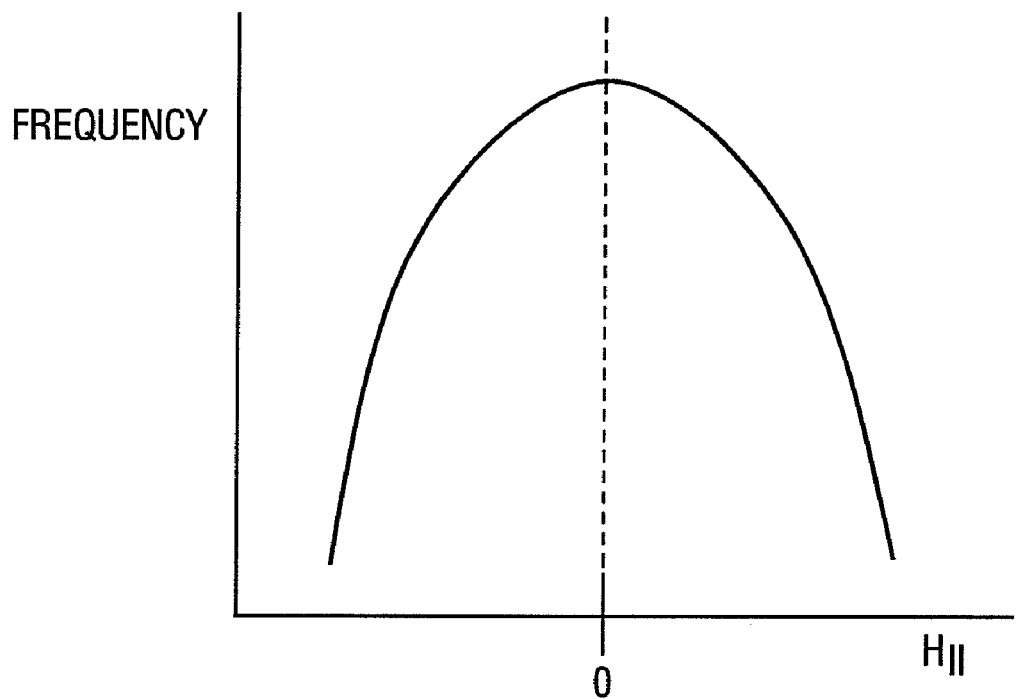
FIG. 8 is a graph of calculated frequency versus magnetic field.

A current density exceeding $10^7$ A/cm$^2$ in one example of this device structure will produce oscillations of the free layer with a trajectory somewhat circling the magnetization direction of the fixed layer. A schematic dependence of the oscillation frequency with applied field in the plane of the free layer is shown in FIG. 8. FIG. 8 schematically illustrates the dependence of the frequency of SMT oscillations, which are not phase locked, with an in-plane magnetic field $H_\parallel$ for the stack shown in FIG. 7.

Figure 9:
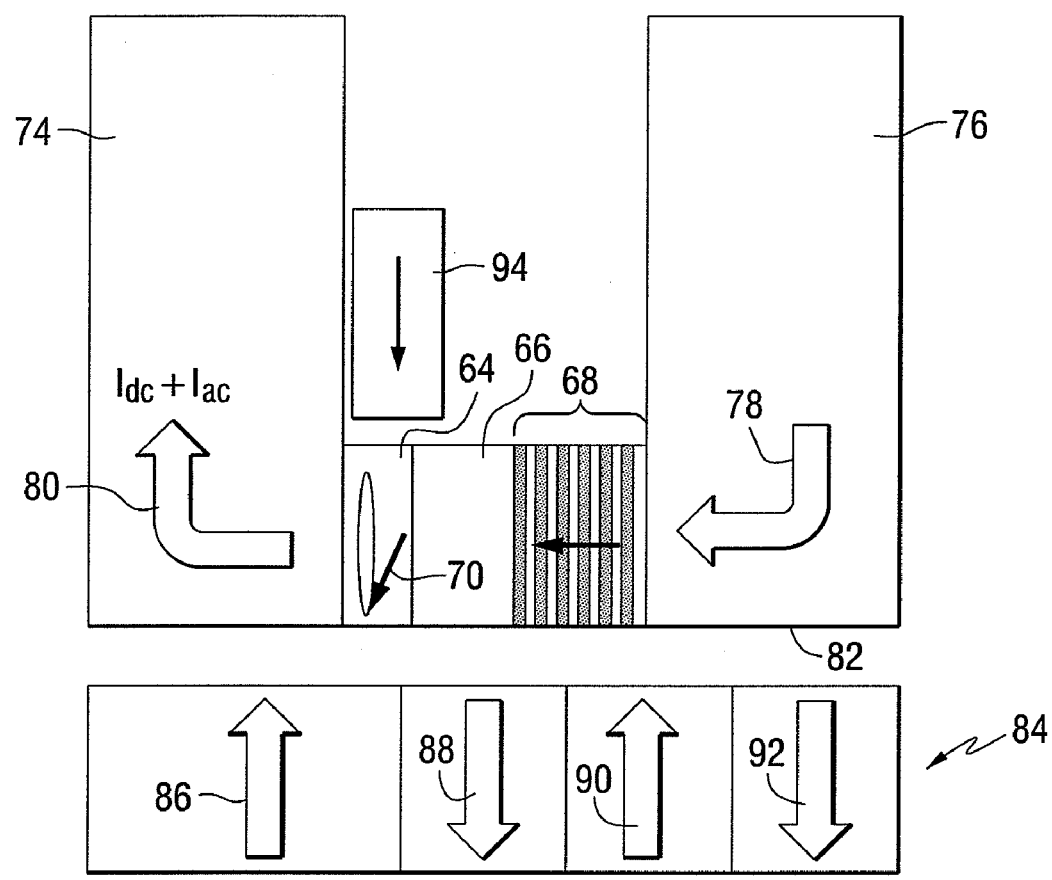
FIG. 9 is a schematic representation of a CPP sensor.

FIG. 9 is a side-view showing the structure of the reader in the context of a magnetic recording head geometry. The CPP reader structure is mounted between shields 74 and 76. A DC current $I_{dc}$ and a microwave current $I_{ac}$ flow through the shields and the CPP structure as illustrated by arrows 78 and 80. The recording head has an air bearing surface 82 that is positioned adjacent to a magnetic recording media 84, which can be a magnetic disc. Information is stored in the media in the form of bits represented by the direction of magnetization of regions forming the bits, as illustrated by arrows 86, 88, 90 and 92. In this example, a perpendicular recording media is shown. A magnetic field source 94 provides a constant in-plane bias field to the free layer of the CPP device. In this example the source 94 is a permanent magnet. In another example, the CPP device can be integrated within a thin film electromagnet such that field from the electromagnet is substantially out of plane.

Magnetic fields from bits in the media produce in-plane fields with respect to the CPP device free layer, causing a change in frequency of SMT oscillation when not phase locked. When phase locked to the microwave current, $I_{ac}$, the oscillation phase changes instead.

Figure 10:
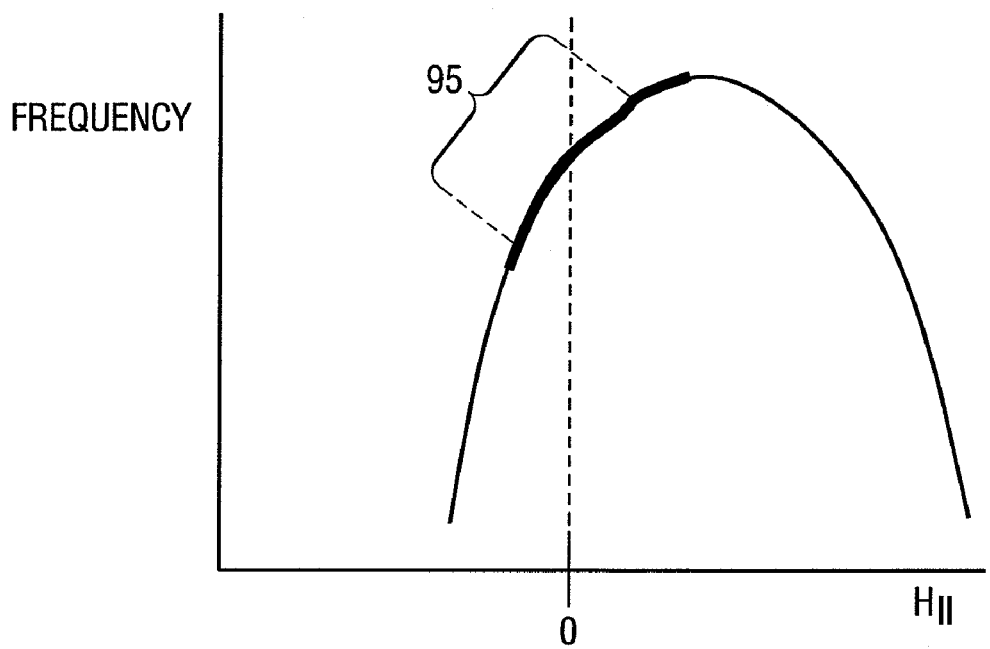
FIG. 10 is a graph of frequency versus magnetic field.

FIG. 10 is a graph that schematically shows the dependence of SMT oscillation frequency on the external in-plane field (such as from an adjacent magnetic storage media) when a permanent magnet bias behind free layer is present. Thus, the frequency vs. net in-plane field for this structure shifts in a manner close to a desired substantially linear region 95 of the transfer curve for the external field range of interest.

When phase locked by the microwave current, the oscillation phase (rather than frequency) varies with the in-plane field (i.e., the magnetic field substantially in the plane of the free layer) with the same close-to-linear transfer curve. The microwave circuit in FIG. 11 converts this phase shift transfer curve to a close-to-linear amplitude-shift transfer curve.

Figure 11:
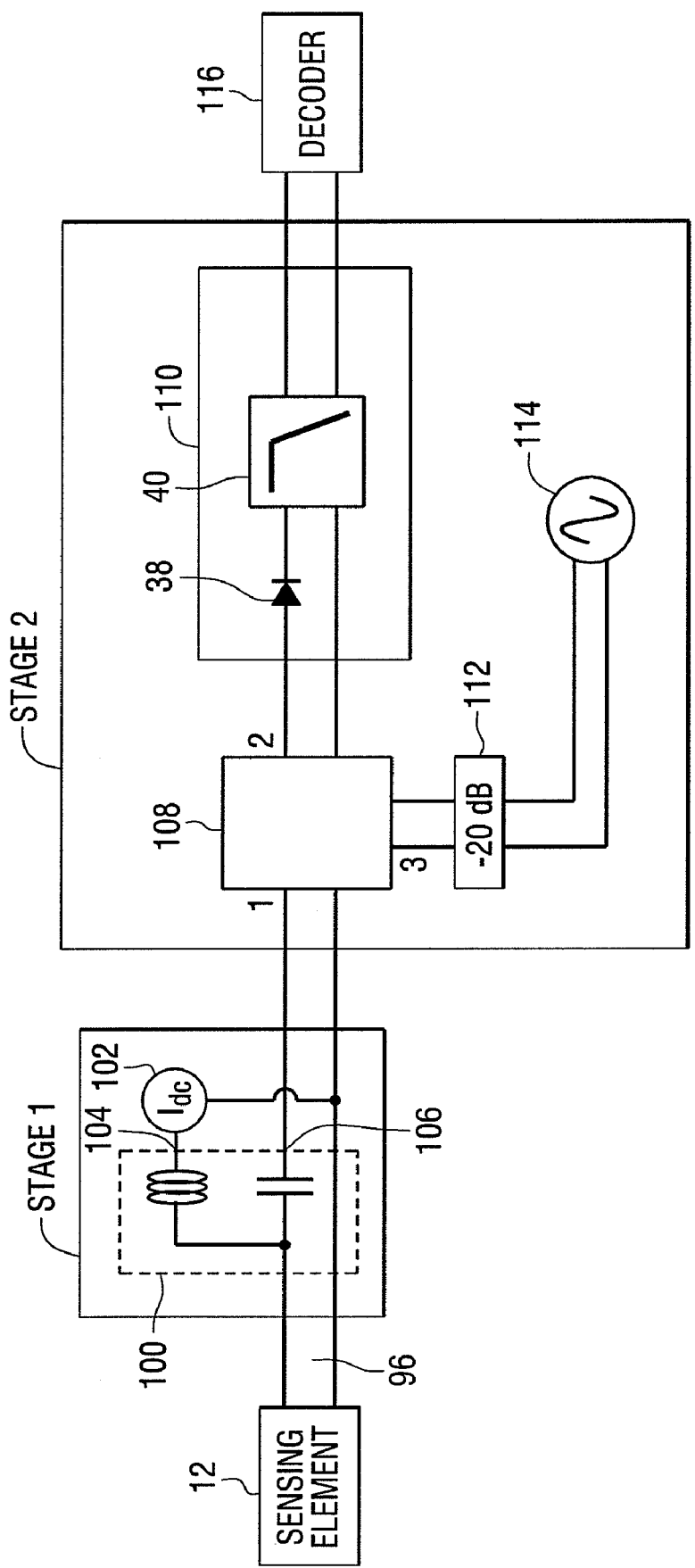
FIG. 11 is a schematic representation of a resonance reader.

In a disc drive implementation, the CPP device 60 is electrically connected to a transmission line 96 leading to a read/write pre-amplifier 98 application specific integrated circuit (ASIC) containing monolithic microwave integrated components (MMIC). Within the pre-amplifier read circuit, signals on the transmission line continue through two general stages, as shown in FIG. 11. In stage 1, the transmission line is connected to the AC+DC port of a bias tee 100. DC current 102 is applied to the CPP device via the transmission line through the inductive port 104 of the bias tee. This DC current causes the SMT precession of the free layer of the CPP device. AC signals can travel between the capacitive port 106 of the bias tee and stage 2.

In stage 2, the capacitive bias tee port from stage 1 is connected to port 1 of a three-port pick-off tee 108. Port 2 is connected to a microwave detector circuit 110, and port 3, which is a −20 dB pick-off channel 112, is connected to a low phase noise oscillator circuit 114. One percent of the power generated from the oscillator travels to the CPP device through port 1, and another 1% of the power travels to the power detector through port 2. Moreover, 99% of the power emerging from the CPP device, either from reflection at the device or generation by the device, travels to port 2.

Microwave power from the source at port 3 phase locks the CPP device at the source frequency, and a standing wave forms on the transmission line between the CPP device and port 1 of the pick-off tee. Depending on the length of the transmission line, and the wavelength of the microwaves from the source, the detector at port 2 will measure RMS power in the range from the minimum to the maximum power present in the standing wave. As the CPP device incurs a phase shift in oscillation due to external magnetic fields, the standing wave amplitude will change as was explained above. In order to realize a linear transfer curve in RMS amplitude, modeling has shown that the proper transmission line length, modulo $2\pi$ in wavelength, should be chosen. The optimum length depends on the particular mode of oscillation and the value of the bias current used. The output of stage 2 passes to a decoder 116.

Figure 12:
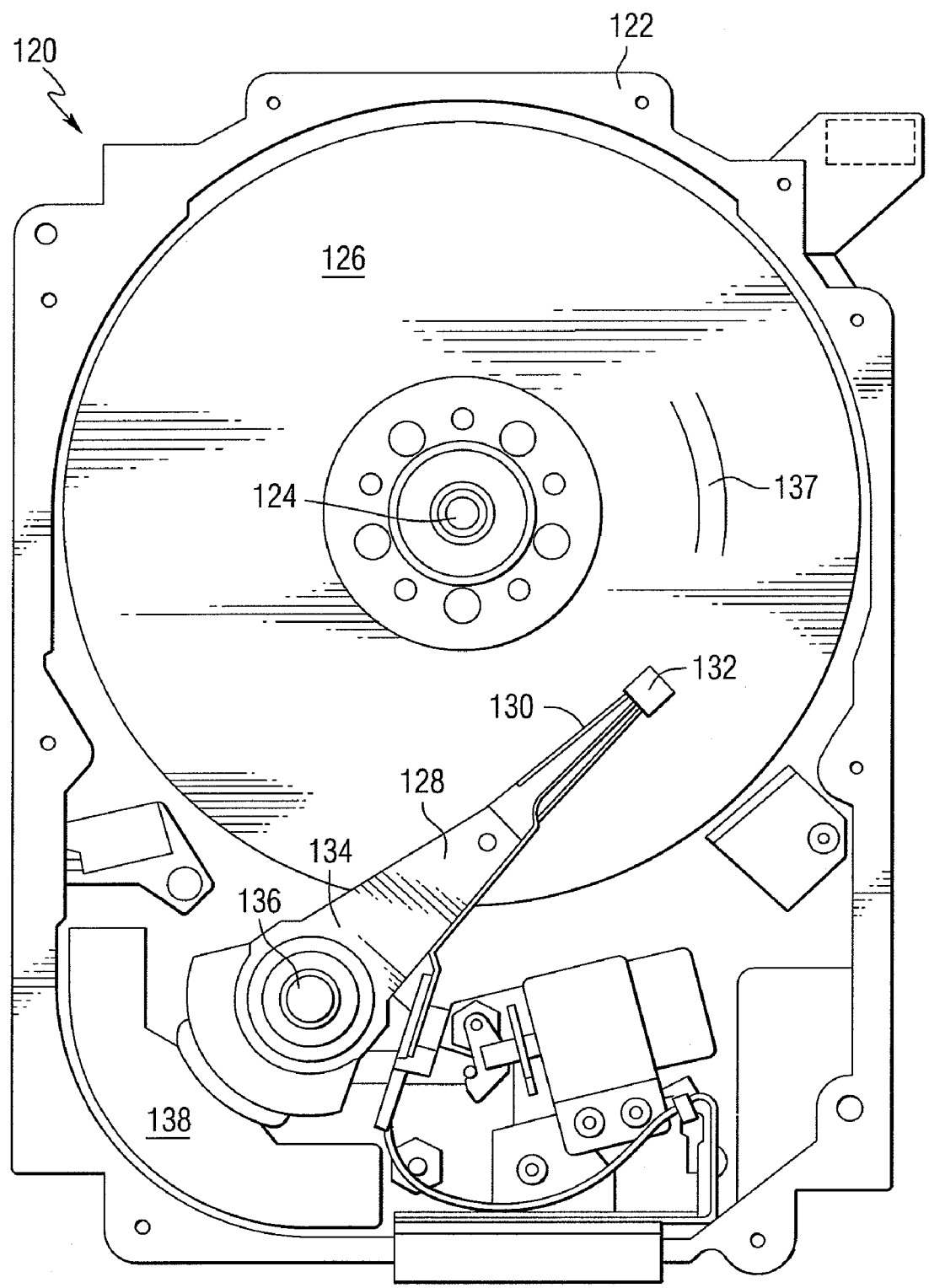
FIG. 12 is a pictorial representation of a disc drive.

FIG. 12 is a pictorial representation of a magnetic storage device in the form of a disc drive 120 that can utilize a reader in accordance with this invention. The disc drive 120 includes a housing 122, with the upper portion removed and the lower portion visible in this view, sized and configured to contain the various components of the disc drive. The disc drive 120 includes a spindle motor 124 for rotating at least one storage medium 126, which may be a magnetic storage medium within the housing 122. At least one arm 128 is contained within the housing 122, with each arm 128 having a first end 130 with a recording head or slider 132, and a second end 134 pivotally mounted on a shaft by a bearing 136. An actuator motor 138 is located at the arm's second end 134 for pivoting the arm 108 to position the recording head 132 over a desired sector or track 137 of the disc 126. The actuator motor 138 is regulated by a controller, which is not shown in this view and is well-known in the art. The reader can be included in the recording head and positioned by the arm such that the reader is adjacent the magnetic storage medium.

In one aspect, the invention provides a readback sensor for high areal density and high data rate magnetic recording. The read element is a CPP nano-pillar driven into magnetic precession via spin torque. The electrical current that biases that CPP device is a sum of a DC current and an AC current that is used to lock the magnetic precession frequency to that of the AC current. Stray magnetic fields from an adjacent magnetic storage medium induce phase shifts between the magnetic precession and the AC current, which are detected using a phase detection scheme, such as has been described in this invention.

In addition to a magnetic recording reader application, this concept is also applicable to generic low-noise/low-field sensor applications. The magnetic field sensitivity range can be controlled using a built-in magnetic bias field, which is achievable in many ways. The bias field source can comprise thin film wire coils surrounding the CPP device or permanent magnets deposited near the CPP device. Furthermore, a thin film coil and magnetic core structure (similar to a ring head structure) surrounding the CPP device should be able to provide at least 10 kOe of bias field.

Once a strong bias field is introduced, any CPP device configuration can be used as a field sensor. Well-known devices such as simple spin valve nano-pillars and spin valve point contacts whose frequency vs. field behavior have been extensively measured could be used.

Figure 13:
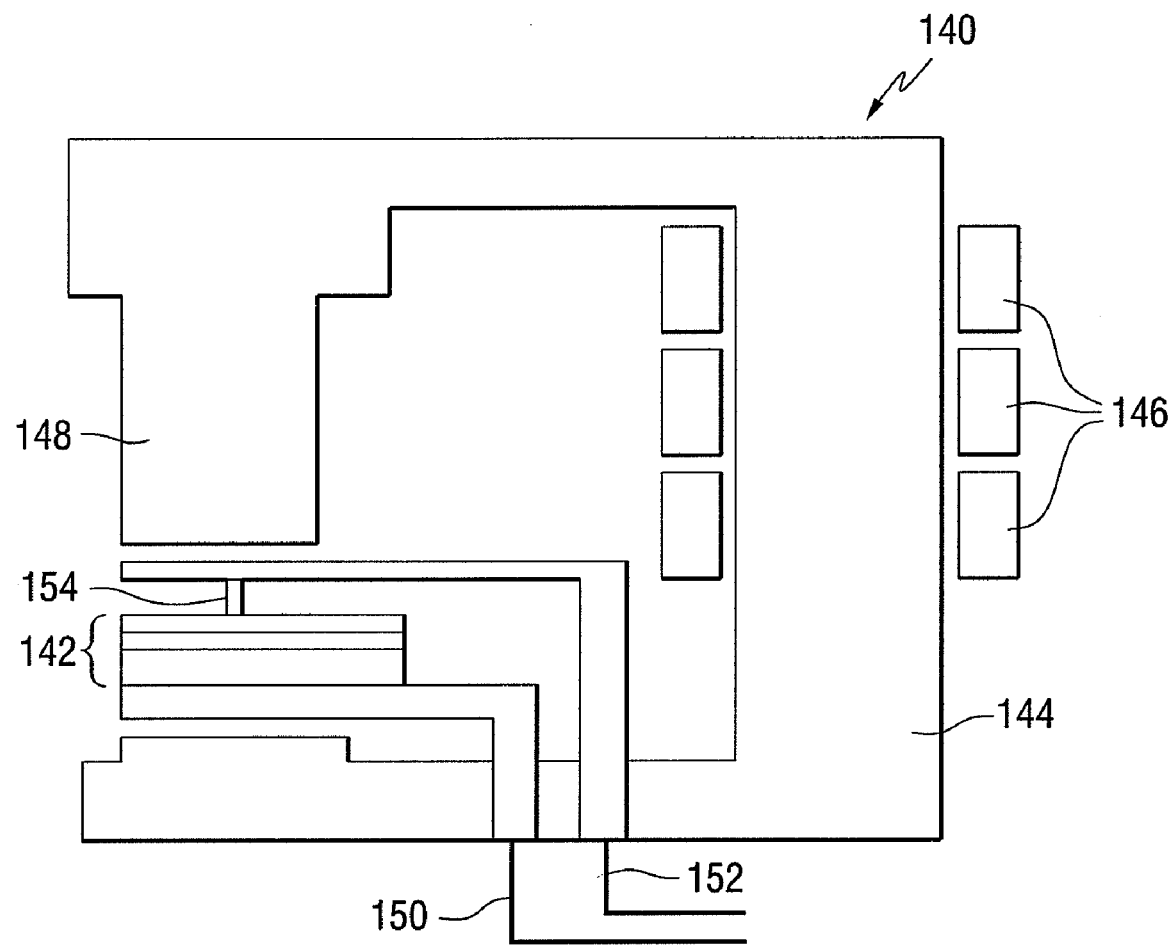
FIG. 13 is a schematic representation of a CPP sensor.

FIG. 13 shows an illustration of a sensor 140 using a point contact CPP device 142 and a surrounding structure, or yoke 144 for generating a bias field. A point contact device is especially attractive, as it is well-known to have a very reproducible linear frequency vs. field behavior as well as intrinsically less oscillation noise than other SMT oscillator devices. These point contacts generally require an out-of-plane field greater than 6 kOe.

Operation of these sensors is the same as for the recording head application. An external field, in addition to the bias field, results in a changed net field at the CPP device. In this configuration, DC current to the coils 146 magnetizes the pole 148, resulting in an out-of-plane field for the oscillator device. The microwave circuit of FIG. 11 supplies the AC and DC inputs to conductors 150, 152 and produces a field sensitive voltage output. A point contact 154 connects one end of the CPP device to one of the conductors.

The phase of the CPP device oscillation shifts, resulting in a shifted standing wave amplitude that is detected. The sensor includes the following basic functional elements: a CPP device, a bias magnetic field source, a transmission line with impedance $Z_0$ (most likely 50Ω) which is terminated at one end by the CPP device, a DC source, a fixed frequency microwave source, and a microwave power detector. Each of these components can be integrated within a single chip, whereby the magnetic elements can be added to already processed semiconductor layers. The inputs to the chip will be power that is routed to the CPP device oscillator, low noise semiconductor oscillator, and possibly the bias field source, as well as the magnetic field that is to be measured. The output will be a voltage from the power detector that indicates standing wave power shift with variation in the applied field. If the noise properties of this field sensor allow a sensitivity of sub-pico-Tesla fields, then this device or arrays of these devices could be used for life-sciences applications such as magnetocardiograms. In order to achieve this level of sensitivity, the source oscillator, which the CPP device phase locks to, must have very low phase and amplitude noise. This may be achieved by using phase locked loop stabilized, temperature controlled oscillator circuitry. The invention can provide high speed sensing of magnetic fields.

While the invention has been described in terms of several examples, it will be apparent to those skilled in the art that various changes can be made to the disclosed examples without departing from the scope of the invention as defined by the following claims. The implementations described above and other implementations are within the scope of the claims.

What is claimed is:

1. An apparatus comprising:
   a current perpendicular to the plane sensing element;
   a DC current source connected to the sensing element;
   a microwave AC current source connected to supply AC current to the sensing element; and
   a detector for measuring a voltage representative of phase difference between the AC current and AC voltage across the multilayer structure when the sensing element is subjected to a magnetic field.

2. The apparatus of claim 1, wherein the detector comprises:
   transmission line coupled to the sensing element;
   a bias tee for coupling the DC current source to the transmission line;
   a microwave source;
   a three port component for coupling the microwave source to the transmission line; and
   a microwave detector coupled to the transmission line.

3. The apparatus of claim 2, wherein the transmission line has a length chosen such that the microwave detector measures standing wave power in a range from a minimum to a maximum power level.

4. The apparatus of claim 1, wherein current from the DC current source causes precession of a direction of magnetization of a free layer in the sensing element and the precession of the direction of magnetization is phase locked to current from the AC current source.

5. The apparatus of claim 4, wherein the detector comprises an amplitude modulation detection circuit.

6. The apparatus of claim 1, further comprising:
   a magnetic field source providing a bias magnetic field for the sensing element.

7. The apparatus of claim 1, further comprising:
   a magnetic storage medium, wherein the phase difference is induced by magnetic fields from a magnetic storage medium.

8. The apparatus of claim 1, wherein the sensing element comprises:
   a point contact sensing element.

9. The apparatus of claim 1, wherein the sensing element comprises:
   a device driven by spin momentum transfer.

10. The apparatus of claim 1, wherein the sensing element comprises:
    spin valve nano-pillars.

11. The apparatus of claim 1, wherein the sensing element includes an electromagnet, and magnetic field from the electromagnet is substantially perpendicular to the plane of the sensing element.

12. A method comprising:
    applying an AC current and a DC current to a current perpendicular to the plane sensing element; and
    detecting a phase difference between the AC current and AC voltage across the sensing element when the sensing element is subjected to a magnetic field.

13. The method of claim 12, further comprising:
    coupling a transmission line to the sensing element, wherein a standing wave is formed on the transmission line due to impedance mismatch between the transmission line and the sensing element.

14. The method of claim 13, wherein the detecting step measures standing wave power and a change in the standing wave power is representative of a phase shift between resistance precession of the sensing element and the AC current.

15. The method of claim 12, wherein the sensing element comprises:
    a magnetically biased multilayer structure including a reference layer and a free layer separated by a spacer layer, wherein the reference layer has magnetic anisotropy perpendicular to the plane of the reference layer and the free layer has magnetic anisotropy in the plane of the free layer.

16. The method of claim 15, wherein the DC current causes precession of a direction of magnetization of the free layer, and wherein the precession of the direction of magnetization is phase locked to the AC current.

17. The method of claim 15, wherein the multilayer structure is subjected to a bias magnetic field substantially out of the plane of the free layer.

18. The method of claim 15, wherein the multilayer structure is subjected to a bias magnetic field substantially in the plane of the free layer.

19. The method of claim 12, wherein the phase difference is induced by magnetic fields from a magnetic storage medium.

20. The method of claim 12, wherein the sensing element comprises:
    a point contact sensing element.

21. The method of claim 12, wherein the sensing element comprises:
    a device driven by spin momentum transfer.

* * * * *